United States Patent [19]

Dages

[11] E Patent Number: Re. 32,686

[45] Reissued Date of Patent: May 31, 1988

[54] DIGITAL FREQUENCY LOCK TUNING SYSTEM

[75] Inventor: Chuck Dages, Rivervale, N.J.

[73] Assignee: General Instrument Corporation, New York, N.Y.

[21] Appl. No.: 916,708

[22] Filed: Oct. 8, 1986

Related U.S. Patent Documents

Reissue of:

[64] Patent No.: 4,476,584
Issued: Oct. 9, 1984
Appl. No.: 10,408
Filed: Feb. 8, 1979

[51] Int. Cl.[4] ..... H04B 1/16
[52] U.S. Cl. ..... 455/182; 455/184;185
[58] Field of Search ..... 455/164, 182, 184–186; 358/191.1, 195.1

[56] References Cited

U.S. PATENT DOCUMENTS

| | | | |
|---|---|---|---|
| 3,961,266 | 6/1976 | Tanaka | 455/182 |
| 4,004,232 | 1/1977 | Amaya | 455/184 |
| 4,085,372 | 4/1978 | Mogi | 455/186 |
| 4,110,695 | 8/1978 | Klank et al. | 455/184 |
| 4,114,100 | 9/1978 | Klank | 455/184 |
| 4,152,654 | 5/1979 | Tanaka | 455/185 |
| 4,419,769 | 12/1983 | Cohen | 455/182 |

*Primary Examiner*—Robert L. Griffin
*Assistant Examiner*—Curtis Kuntz
*Attorney, Agent, or Firm*—Hopgood, Calimafde, Kalil, Blaustein & Judlowe

[57] ABSTRACT

A tuning system for use in radio frequency multi-signal receiving systems, e.g. a CATV converter, utilizes a closed feedback loop digital arrangement for channel selection (local oscillator frequency control) and channel fine tuning. The system may be implemented either via discrete hardware or through the use of microprocessor controlled apparatus.

2 Claims, 2 Drawing Sheets

DIGITAL FREQUENCY LOCK TUNING SYSTEM

Matter enclosed in heavy brackets [ ] appears in the original patent but forms no part of this reissue specification; matter printed in italics indicates the additions made by reissue.

FIELD OF THE INVENTION

This invention relates to tuning systems for radio frequency (R.F.) multi-channel receiving systems and, more particularly, to a tuning system employing digital processing and a storage look-up table for effecting channel selection and fine tuning.

DESCRIPTION OF THE PRIOR ART

Tuning systems for R.F. receiving systems are well known and widely used. Such systems essentially comprise a variable frequency local oscillator used in a hetrodyne application to frequency shift a desired incoming R.F. signal (e.g., a television program channel spectrum) to that of a fixed intermediate frequency band. Such tuning systems are of two basic types; open loop and closed loop.

Open loop systems employ a variable frequency local oscillator, the frequency of which is manually or otherwise set—but which is not monitored to continuously assure that the oscillator is actually operating at the desired frequency. Changes in component values, as a result of component aging and/or ambient temperature changes, can cause the actual frequency of the oscillator to deviate from the desired frequency. In an open loop system this frequency deviation, if not undetected, results in degraded reception.

Closed loop systems, to avoid the disadvantages of open loop systems, incorporate monitoring techniques for frequency error detection and correction. That is, closed loop systems sense the actual output frequency of the variable frequency oscillator; compare the actual frequency with the desired frequency indicated by the channel selection apparatus; detect any frequency error; and apply necessary correction factors to shift the actual oscillator frequency to the desired value. Closed loop systems therefore are superior to comparable grade open loop systems in that frequency deviation in a closed loop system, is detected and corrected.

It is therefore an object of this invention to provide an improved tuning system R.F. receiver apparatus which effects and maintains automated channel reception and channel fine tuning.

SUMMARY OF THE INVENTION

In accordance with the invention, a closed loop tuning system is implemented utilizing digital techniques and components.

It is a feature of the invention that a first digital word is generated which represents the frequency of a variable frequency local oscillator over a predetermined sampling period.

It is a further feature of the invention that a second digital word is retrieved from digital storage in response to incoming channel selection information, the second digital word representing the desired frequency of the variable frequency oscillator.

It is another feature of the invention that the first and second digital words are compared and the difference in value between the digital words used to shift the actual oscillator frequency to the desired oscillator frequency.

The foregoing and other objects and features of this invention will be more fully understood from the following description of an illustrative embodiment thereof taken in conjunction with the accompanying drawings.

DETAILED DESCRIPTION

Figure 1:
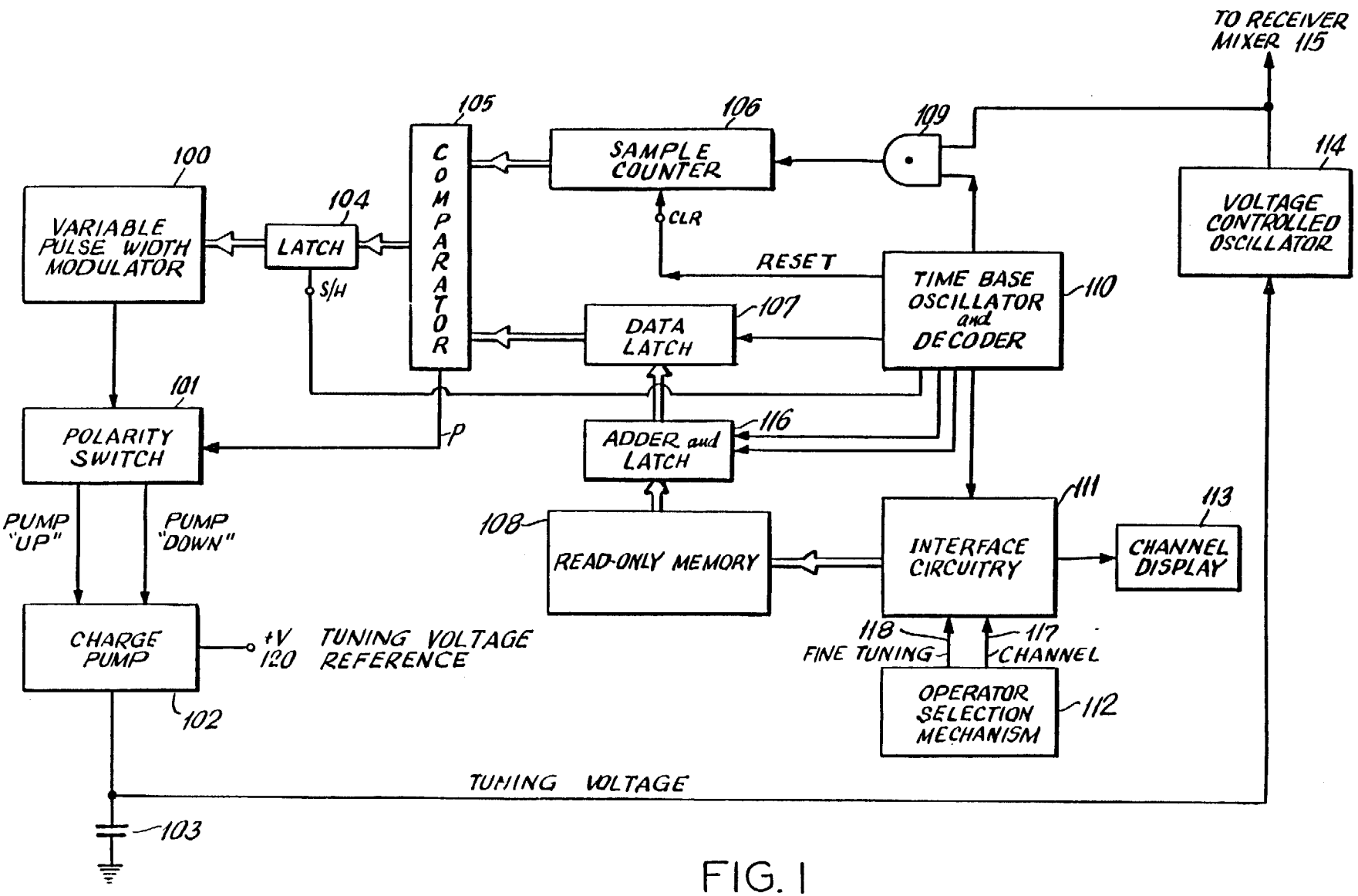
FIG. 1 illustrates one embodiment of the instant invention in block diagram form.

Referring now to FIG. 1, there is illustrated a block diagram of one embodiment of the invention. The circuitry of FIG. 1 is designed to sense the actual operating frequency of local oscillator 114, and to maintain (or change) the actual frequency of operation to a desired frequency of operation represented by a particular operative one of plural digital words stored in memory 108. The desired frequency is retrieved from memory 108 in response to incoming channel information via operator selection mechanism 112. The desired frequency, represented by the retrieved digital word, is stored in latch 107 and compared with the actual frequency determined by sample counter 106 in conjunction with gating and timing circuitry. The difference between actual and desired frequency is used to add or delete charge from capacitor 103 which, in turn, changes the frequency of operation. Circuit operation is described in greater detail hereinafter.

More particularly, oscillator 114 is a voltage controlled oscillator, the output of which is applied to a circuit terminal 115 and from there to a mixer circuit (not shown) in an R.F. receiving system, e.g., a CATV converter. The output of oscillator 114 is utilized as the local oscillator in a per se conventional hetrodyne application to beat a desired component signal band of an incoming R.F. signal spectrum to a fixed intermediate frequency for use in the receiving system. The output frequency of oscillator 114 is dependent on the voltage present across capacitor 103, i.e., the frequency of oscillator 114 will vary in direct relation to the addition or deletion of charge in capacitor 103. The operation of such a voltage controlled oscillator and the associated mixer circuit is well known in the art and will not be further detailed herein.

Operator selection mechanism 112 inputs channel selection information and fine tuning information into the tuning system. Mechanism 112 can take the form of a keyboard, a thumb wheel encoded switch, a rotary dial with associated circuitry or any other suitable electronic/electromechanical device or circuit per se well known and simply serves to represent each receiver channel, and any associated fine tuning information, by unique electrical signals. These channel/fine tuning electrical signals are converted into unique digital addresses, for example, by an analog-to-digital converter with each address representing a particular storage location in Read Only Memory (ROM) 108. The digital addresses are supplied to interface circuitry 111 and from there to ROM 108 in a manner detailed hereinafter. ROM 108 stores a plurality of digital words, each of which represent the desired operating frequency of oscillator 114 for a particular receiver operating channel. Channel display 113 displays each channel selected for reference by the receiver operator.

Time base oscillator and decoder 110 provides timing and control signals for the entire digital tuning system. Appropriate timing and control signals are applied to interface circuitry 111, latches 104 and 107, and gate 109. The utilization of the timing signals in conjunction with the operation of the circuit will be detailed hereinafter. Timing circuitry such as that included within oscillator and decoder 110 is well known in the art. One specific implementation simply comprises a cascaded oscillator and counter, the counter, in turn, driving plural coincidence gates or integrated circuit decoders for decoding corresponding time intervals within an overall cyclically recurring oscillator time pulse counting cycle.

The timing signals from oscillator and decoder 110 selectively enable gate 109 for a fixed period of time thereby applying the output of oscillator 114 to an initially cleared counter 106. Counter 106 counts the oscillator output pulses and compiles a first digital word representative of the actual oscillator frequency (as measured by the number of oscillations occurring within the fixed gating period). Comparator 105 compares this first digital word with a second digital word, retrieved from memory 108 and stored in latch 107 in a manner to be detailed hereinafter, and the difference in binary value between the first and second digital words as determined by comparator 105 is stored in latch 104. Comparator 105 also produces a polarity level signal P which indicates whether the difference stored in latch 104 is a positive or negative value.

Variable pulse width modulator 100 accepts the binary difference word stored in latch 104 and produces an output pulse whose width is dependent on the magnitude of the binary number, i.e., a narrow output pulse is produced in response to a small binary number while a wide output pulse is produced in response to a large binary number. The output pulse from modulator 100 is applied to a polarity switch 101. Various circuitry can be employed to implement the functions required of modulator 100. One suggested implementation is to simply apply the binary number from latch 104 to one input of a comparator circuit and apply the output of an initially cleared binary counter to the remaining comparator input, the binary counter being advanced to a binary state equal to the binary number from latch 104. The output of the comparator circuit is initially established at a binary one level, e.g., a logical "1" level and assumes a logical "0" level when the count of the binary counter equals the binary number stored in latch 104. The output of the comparator thus produces a wide pulse in response to a large number stored in latch 104 (corresponding to a relatively large number of counts) and a narrow pulse in response to a small number stored in latch 104.

Polarity switch 101 receives the variable width pulses from modulator 100 and the error polarity signal from comparator 105. Detector 101, in response to polarity signal P, steers (gates) the variable width pulses from modulator 100 to generate either a "pump-up" signal or a "pump-down" signal for application to charge pump 102. Switch 101 may comprise simple steering gates which will direct the variable width pulse from modulator 100 to the "pump-up" output in response to a positive polarity signal and direct the variable width pulse to the "pump-down" output in response to a negative polarity signal. Other appropriate circuit arrangements could of course also be used to implement switch 101.

Charge pump 102 adds or deletes charge from capacitor 103 in response to the "pump-up" and "pump-down" signals applied thereto from detector 101. Adding or deleting charge to capacitor 103 varies the voltage across the capacitor and thus alters the frequency of oscillator 114 in the manner described above. Charge pump 102 may comprise a circuit arrangement wherein, in response to a "pump-up" signal, charging current from tuning voltage reference terminal 120 is applied to capacitor 103 for an interval of time equal to the width of the "pump-up" signal pulse. The width of the pump-up" signal pulse (and thereby also the charge increment to capacitor 103) is of course equal to the width of the output pulse from modulator 100. Alternatively, charge pump 102 responds to a "pump-down" signal by draining charge from capacitor 103 for an interval of time equal to the width of the "pump-down" signal pulse. The width of the "pump-down" signal pulse is also equal to the width of the pulse from modulator 100. Specific circuits necessary to accomplish the aforesaid functions of charge pump 102 are well known in the art. Thus, for example, the "pump-up" signal may enable a transistor switch and limiting resistor connecting terminal 120 and capacitor 103, while the "pump-down" signal enables a transistor switch connecting capacitor 103 and circuit ground via a discharge current limiting resistor.

The operation of the embodiment in FIG. 1 will now be described in detail. Assume that the circuitry in FIG. 1 has been reset to an initial state by oscillator and decoder 110 in preparation for operation. Information representative of a desired channel is applied to mechanism 112 and in response thereto a digital address word, generated in the manner described above, is applied to circuitry 111 via path 117. Circuitry 111, in response to a command signal from oscillator and decoder 110, applies the digital address to an address input of ROM 108 and the digital word representing the desired operating frequency for the selected channel is retrieved from ROM 108, stored in adder and latch 116 (employed for fine tuning purposes below discussed), and applied to data latch 107. The digital word is stored in latch 107 in response to a command signal from oscillator and decoder 110.

For a predetermined, fixed and repetitive period of time gate 109 is enabled by a command signal from oscillator and decoder 110. In response thereto, the output signal from local oscillator 114 is passed through gate 109 and applied to an initially reset counter 106. Counter 106 commences to count the oscillator output pulses and continues to do so as long as gate 109 remains enabled. Oscillator and decoder 110 maintains gate 109 in an enabled state for a predetermined interval of time. Subsequent to the termination of the predetermined interval gate 109 is disabled and, accordingly, at this time, counter 106 has stored therein a digital word representing the actual frequency of oscillator 114.

The digital word stored in counter 106, representing the actual oscillator frequency, is compared in comparator 105 with the digital word stored in latch 107, representing the desired oscillator frequency. The result of the comparison by comparator 105, is the generation of a binary number frequency error signal, and the generation of a polarity level signal indicating whether the digital word stored in counter 106 is greater than the digital word stored in latch 107 or vice versa. The binary number, representing the binary difference between the actual and desired frequencies is stored in latch 104 and the polarity signal is applied to error polarity responsive switch 101.

The binary number stored in latch 104 is applied to modulator 100. As described above, this binary number is utilized by modulator 100 to generate a variable width pulse, the pulse width being directly dependent on the magnitude of the latched binary number (frequency error amplitude). The variable width output pulse from modulator 100 is applied to switch 101 along with the polarity signal from comparator 105. Switch 101, in response to the polarity signal, applies the variable width output pulse to either the "pump-up" or "pump-down" output and from there to charge pump 102. Charge pump 102 then either adds charge or removes charge from capacitor 103, as described above, thereby changing the frequency of oscillator 114 from the previously obtained actual frequency to the desired frequency until, at steady state, the two are substantially equal.

The process just described will continue in response to command signals from oscillator and decoder 110 to continuously monitor the output frequency of oscillator 114 and change, if necessary, the actual frequency of oscillation to the desired frequency of oscillation. It is of course understood that each time a new receiver channel is selected by operator selection mechanism 112 the circuit operation just described will serve to change the frequency of oscillator 114 to the new operating channel frequency.

An additional capability of the instant invention relates to the use of fine-tuning. More particularly, the circuit of FIG. 1 is designed to operate in a number of different R.F. receiver environments and in each such environment, minor circuit value variations in the remainder of the R.F. receiver configuration may require a frequency of oscillation for the hetrodyning local oscillator 114 slightly different than the nominal value stored in ROM 108. Therefore, in order to achieve these slight frequency changes, the instant invention provides for the input of fine-tuning information.

The fine tuning information is entered via selection mechanism 112. In response thereto mechanism 112 generates a digital address for ROM 108 in the manner described above, the location being addressed having stored therein a digital word representative of a relatively small increment in the desired operating frequency. This fine tune digital word is stored in the latch portion of the adder and latch 116 in response to a command from circuitry 110, and added to the principal frequency determining word also stored in the latch/adder 116. The sum of the two latched words, i.e., the principal frequency channel selection value and the fine tuning increment, is then applied to and stored in latch 107 and the sum is compared with the actual frequency in the manner described above. In this manner the frequency of local oscillator 114 can be slighly varied in response to the input of fine tuning information, with the amount of the frequency change being dependent on the value of the third digital word stored in ROM 108.

Figure 2:
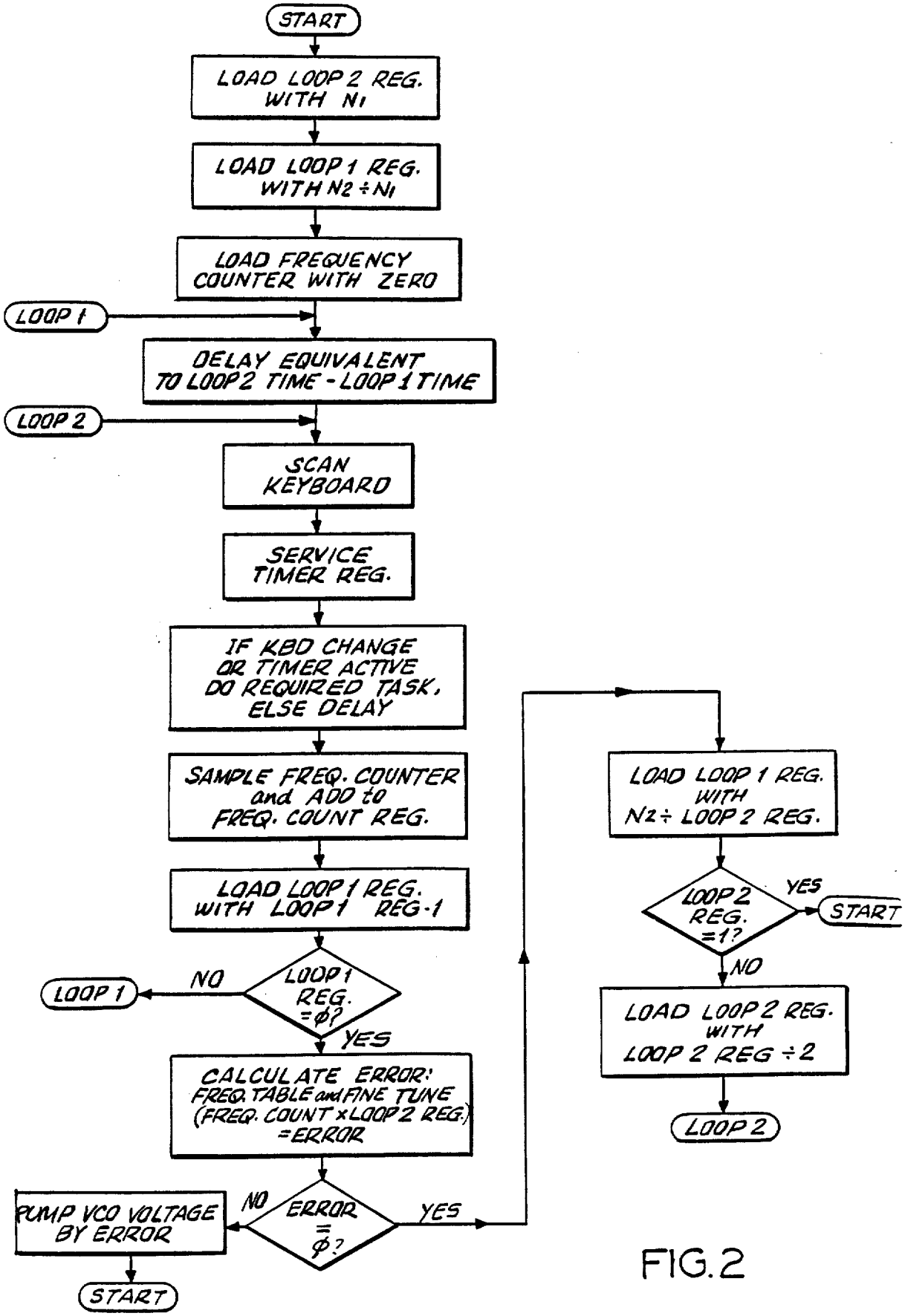
FIG. 2 illustrates a flow chart for a microprocessor implementation of the instant invention.

The circuitry of FIG. 1 can be implemented with standard circuit elements as above discussed. However, it is also possible to implement the functions performed by the circuitry of FIG. 1 with a microprocessor configuration. Shown in FIG. 2 is a flow chart for program control of such a microprocessor configuration wherein the microprocessor performs all the functions of the circuitry of FIG. 1, except for those functions performed by local oscillator 114, input mechanism 112, display 113, charge pump 102 and capacitor 103. The flow chart of FIG. 2 comprises general programming capable of being used with a number of commercially available microprocessors. Actual adaptation of the flow chart to a particular microprocessor configuration would be readily accomplished by one skilled in the art of microprocessor utilization. In conjunction with the use of this flow chart it is to be understood that $N_1=2(n-1)$ where n is the number of intermediate error calculations made before restarting and $N_2$=the total number of times through loops before restarting when there are no errors. Also, $N_1$ is a positive integer $\geqq 1$ and $N_2 \div N_1$ is an integer.

Although a specific embodiment of this invention has been shown and described, it will be understood that various modifications may be made without departing from the spirit of this invention.

What is claimed is:

1. A closed loop digital tuning system, the system comprising, oscillator means responsive to a variable control voltage for generating an oscillation having a frequency dependent on the magnitude of said control voltage, sampling means for sampling the actual output frequency of said oscillation means for a predetermined interval of time and for generating a first digital word representing the actual value of said frequency,

[means responsive to incoming channel information for generating a selected one of a plurality of address words, each address word representing a particular operating channel in a CATV system, memory means for storing a plurality of second digital words, each of said second digital words representing any desired frequency of oscillation for said oscillator means, means responsive to the address words for retrieving from said memory means one of said second digital words, the particular location of said second digital word within said memory means being identified by said address word representing a particular operating channel in said CATV system,]

*memory means responsive to incoming channel information for providing one of a plurality of second digital words, each of said second digital words representing a particular frequency of oscillation for said oscillator means,* means for storing the second digital word retrieved from said memory means, comparator means for comparing the values of said first digital word with the value of said stored second digital word, and means responsive to a difference in value between said first digital word and said stored second digital word determined by said comparator means for varying said control voltage for said oscillator means, whereby said actual frequency value is changed to said desired frequency value, wherein there is further included means responsive to fine tuning information for retrieving a third digital word from said memory means, means for adding said third digital word to said second digital word, and means for applying the sum of said second and third digital words to said comparator means.

2. A closed loop digital tuning system, the system comprising, oscillator means responsive to a variable control voltage for generating an oscillation having a frequency dependent on the magnitude of said control voltage, sampling means for sampling the actual output frequency of said oscillation means for a predetermined interval of time and for generating a first digital word representing the actual value of said frequency,

[means responsive to incoming channel information for generating a selected one of plurality of address words, each address word representing a particular operating channel in a CATV system, memory means for storing a plurality of second digital words, each of said second digital words representing any desired frequency of oscillation for said oscillator means, means responsive to the address words for retrieving from said memory means one of said second digital words, the particular location of said second digital word within said memory means being identified by said address word representing a particular operating channel in said CATV system,]

*memory means responsive to incoming channel information for providing one of a plurality of second digital words, each of said second digital words representing a particular frequency of oscillation for said oscillator means,* means for storing the second digital word retrieved from said memory means, comparator means for comparing the values of said first digital word with the value of said stored second digital word, and means responsive to a difference in value between said first digital word and said stored second digital word determined by said comparator means for varying said control voltage for said oscillator means, whereby said actual frequency value is changed to said desired frequency value, wherein said sampling means includes a binary counter for counting cycles of said output oscillation of said oscillator means, and means for applying said oscillation to said binary counter for said predetermined interval of time, wherein said control voltage varying means includes means responsive to the difference in value between said first and second digital words for generating a variable width pulse, the width of said pulse being directly related to the difference in binary value between said first and second digital words, wherein there is further included means for determining the polarity of the difference in value between said first and second digital words, and means responsive to a positive polarity and to said variable width pulse for decreasing the value of said control voltage, wherein there is further included means responsive to fine tuning information for retrieving a third digital word from said memory means, means for adding said third digital word to said second digital word, and means for applying the sum of said second and third digital words to said comparator means.

* * * * *